(12) United States Patent
Heck et al.

(10) Patent No.: US 7,687,297 B2
(45) Date of Patent: Mar. 30, 2010

(54) FORMING A CANTILEVER ASSEMBLY FOR VERTICAL AND LATERAL MOVEMENT

(75) Inventors: John Heck, Berkeley, CA (US);
Tsung-Kuan Allen Chou, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 444 days.

(21) Appl. No.: 11/824,465

(22) Filed: Jun. 29, 2007

(65) Prior Publication Data

US 2009/0001486 A1    Jan. 1, 2009

(51) Int. Cl.
*H01L 21/00* (2006.01)

(52) U.S. Cl. ................... 438/50; 438/52; 257/415; 257/E29.324; 257/E21.001

(58) Field of Classification Search .............. None
See application file for complete search history.

(56) References Cited

U.S. PATENT DOCUMENTS

| | | | | |
|---|---|---|---|---|
| 5,600,383 | A * | 2/1997 | Hornbeck | 348/771 |
| 6,835,589 | B2 * | 12/2004 | Pogge et al. | 438/52 |
| 7,273,693 | B2 * | 9/2007 | Nikkel et al. | 430/321 |
| 7,354,788 | B2 * | 4/2008 | Bar-Sadeh et al. | 438/52 |
| 7,494,593 | B1 * | 2/2009 | Chen et al. | 216/2 |

OTHER PUBLICATIONS

U.S. Appl. No. 11/731,304, filed Mar. 30, 2007, entitled "Seek-Scan Probe (SSP) Memory Including Mechanism For Track Correction," by Tsun-Kuan Allen Chou.
U.S. Appl. No. 11/725,647, filed Mar. 19, 2007, entitled "Seek-Scan Probe (SSP) Memory With Sharp Probe Tips Formed At CMOS-Compatible Temperatures," by John Heck.
U.S. Appl. No. 11/644,650, filed Dec. 21, 2006, entitled "Seek-Scan Probe (SSP) Including See-Saw Scan Probe With Redundant Tip," by Tsung-Kuan Allen Chou.

* cited by examiner

*Primary Examiner*—Zandra Smith
*Assistant Examiner*—Khanh B. Duong
(74) *Attorney, Agent, or Firm*—Trop, Pruner & Hu, P.C.

(57) ABSTRACT

In one embodiment, the present invention includes a method for forming a sacrificial oxide layer on a base layer of a microelectromechanical systems (MEMS) probe, patterning the sacrificial oxide layer to provide a first trench pattern having a substantially rectangular form and a second trench pattern having a substantially rectangular portion and a lateral portion extending from the substantially rectangular portion, and depositing a conductive layer on the patterned sacrificial oxide layer to fill the first and second trench patterns to form a support structure for the MEMS probe and a cantilever portion of the MEMS probe. Other embodiments are described and claimed.

11 Claims, 10 Drawing Sheets

FORMING A CANTILEVER ASSEMBLY FOR VERTICAL AND LATERAL MOVEMENT

BACKGROUND

Seek-scan probe (SSP) memory is a type of memory that uses a non-volatile storage media as the data storage mechanism and offers significant advantages in both cost and performance over conventional charge storage memories. Typical SSP memories include storage media made of materials that can be electrically switched between two or more states having different electrical characteristics, such as resistance or polarization dipole direction.

SSP memories are written to by passing an electric current through the storage media or applying an electric field to the storage media. Passing a current through the storage media is typically accomplished by passing a current between a probe tip on one side of the storage media and an electrode on the other side of the storage media. Current SSP memories use probe tips positioned on the free end of one or more microelectromechanical systems (MEMS) probes. In an idle state each MEMS probe maintains the probe tip at a certain distance from the storage media, but before the electric field or current can be applied to the storage media the probe tip must usually be brought close to, or in some cases in direct contact with, the storage media.

In some SSP memories, to obtain a sufficient signal-to-noise ratio for read/write/erase operations on the storage media, electrical circuitry such as amplifiers, signal processors, and so forth may be in close proximity to the MEMS probe. One way of achieving this proximity is to place the MEMS probes on a complementary metal oxide semiconductor (CMOS) wafer in or on which the needed circuitry has already been formed. Unfortunately, placing sharp-tipped MEMS probes on a CMOS wafer has been exceedingly difficult because the high-temperature process required to make sharp-tipped probes are incompatible with the post-processing requirements of CMOS wafers; in essence, the high-temperature processes alter or destroy circuitry or other elements formed on the CMOS wafer.

One solution to putting sharp-tipped MEMS probes on a CMOS wafer has been to fabricate the MEMS probes separately and then transfer them and mount them on the surface of a CMOS wafer. This, however, is a difficult and time-consuming task that results in high costs and low yields.

DETAILED DESCRIPTION

In various embodiments, a cantilever-based probe tip may be formed using different processes to enable movement of the cantilever in both lateral and vertical directions. In this way, such a cantilever assembly may be included in a seek-scan probe (SSP) memory device to enable improved tracking of a media wafer during read, write and erase operations.

As will be discussed further below, in some embodiments a trench refill process may be performed to fabricate a cantilever capable of both vertical and lateral movement. In other implementations, such a cantilever assembly may be formed using a deposition process in which a relatively thick film layer is deposited and patterned to obtain the cantilever structure.

Figure 1:
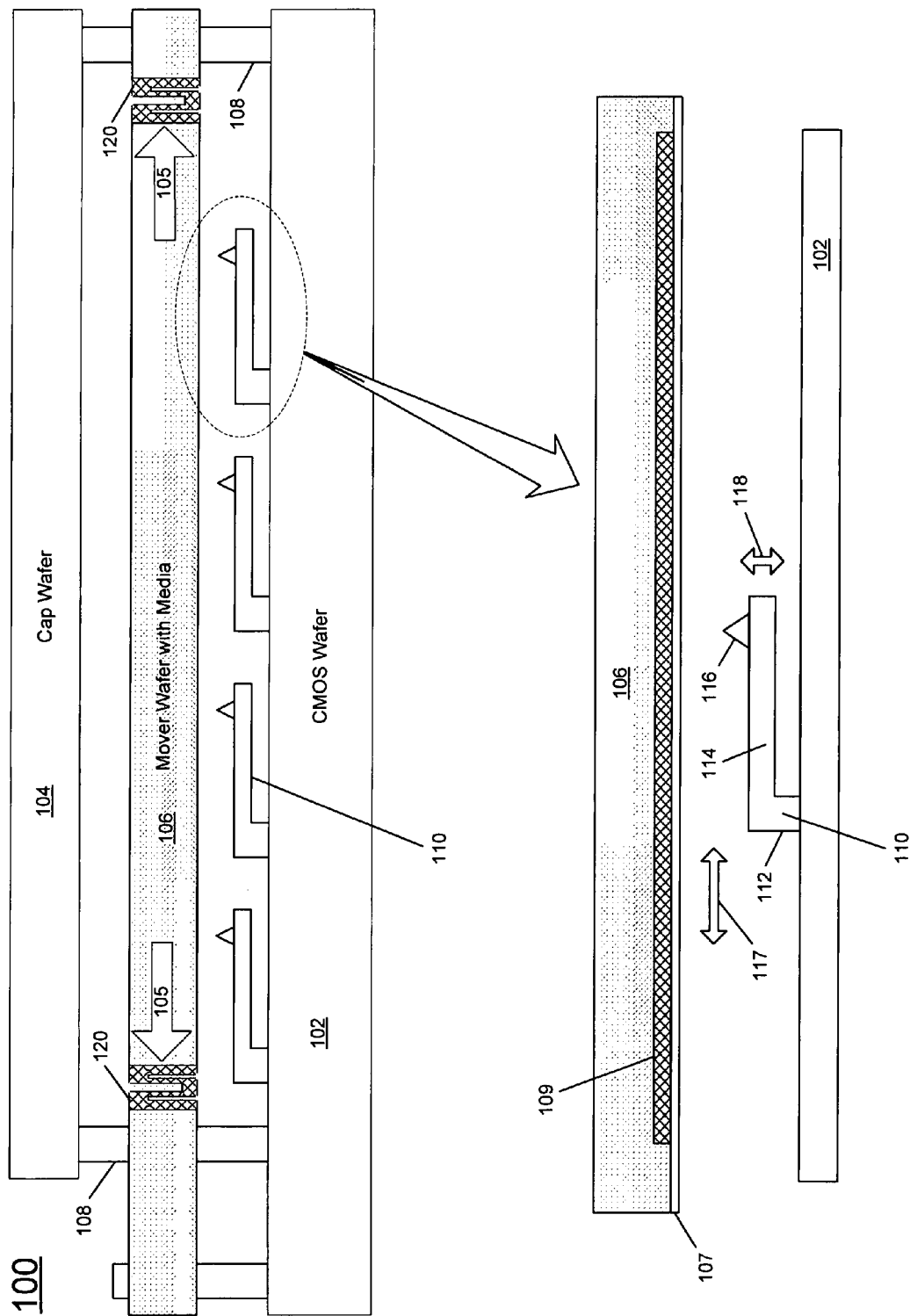
FIG. 1 is a block diagram of a memory device in accordance with one embodiment of the present invention.

FIG. 1 illustrates an embodiment of a SSP memory 100. SSP memory 100 includes a CMOS wafer 102 over which a cap wafer 104 is positioned and supported by supports 108. Together, supports 108 and cap wafer 104 form a sealed enclosure within which a mover wafer 106 is suspended, also from supports 108, such that is it substantially parallel to the surface of CMOS wafer 102. As illustrated by arrows 105, mover wafer 106 is capable of motion relative to CMOS wafer 102 in a plane substantially parallel to the surface of the CMOS wafer (i.e., the x-z plane). One or more MEMS probes 110 are formed on a surface of CMOS wafer 102 so that the sharpened tip 116 of each MEMS probe 110 can come close to, or make contact with, the lower surface of mover wafer 106 when MEMS probes 110 are deflected vertically, as illustrated by arrow 118. Further as shown in FIG. 1, embodiments may include lateral movement of MEMS probe 110, as illustrated by arrow 117.

In addition to supporting the other components of SSP memory 100, CMOS wafer 102 can include therein circuitry that controls the operation of memory 100. Examples of circuitry that can be contained on CMOS wafer 102 include activation electrodes (not shown) that cause MEMS probes 110 to deflect upward toward mover wafer 106 and laterally; circuitry to send signals to sharpened tip 116 so that it can write data into storage media 107 on mover wafer 106; sensing and amplifying circuitry to receive, condition and amplify signals received from sharpened tip 116 when it reads data from storage media 107; memory to buffer and/or store data read from or written to, storage media 107; logic circuitry and/or software to encode and/or decode data that is written to or read from the storage media on mover wafer 106; and so forth.

As noted above, cap wafer 104 is supported over CMOS wafer 102 by supports 108. Together with supports 108, cap wafer 104 forms an enclosure within which mover wafer 106, cantilever probes 110, and other components of SSP memory 100 are housed.

Mover wafer 106 carries the storage media 107 on which SSP memory 100 writes data and from which it reads data. Mover wafer 106 can also include other elements such as electrodes 109 between storage media 107 and wafer 106 that facilitate reading and writing of data on storage media 107. Mover wafer 106 is supported between cap wafer 104 and CMOS wafer 102 by a suspension 120 coupled to supports 108. Suspension 120 provides electrical connections to the mover wafer and allows the mover wafer to move substantially parallel to the CMOS wafer, enabling memory 100 to change the x-z position at which the sharpened tips 116 of MEMS probes 110 read and write data to and from storage media 107. To enable mover wafer 106 to move in the x-z plane, SSP memory 100 also includes a drive mechanism (not shown) coupled to the mover wafer. In one embodiment, mover wafer 106 is composed of a single-crystal silicon, although in other embodiments polysilicon, silicon germanium ($Si_xGe_y$) or other variant of silicon may be used. Mover wafer 106 has a layer of storage media 107 deposited thereon on the surface of the wafer that faces MEMS probes 110. In one embodiment, storage media 107 is a chalcogenide material, although in other embodiments it can be a different type of material such as a ferroelectric or polymer material.

MEMS probes 110 are integrally formed on a surface of CMOS wafer 102. Although the illustrated embodiment shows the MEMS probes as cantilever-type probes, other embodiments can use other types of probes, such as see-saw-type probes; still other embodiments can include combinations of different types of probes. Each cantilever MEMS probe 110 includes a support or pedestal 112 formed on the surface of CMOS wafer 102 and a beam 114 that includes a fixed end attached to pedestal 112 and a free end opposite the fixed end. In the embodiment shown the beam 114 and pedestal 112 are integrally formed of the same material, but in other embodiments beam 114 and pedestal 112 need not be formed integrally and need not be formed of the same material. Examples of materials that can be used for pedestal 112 and/or beam 114 include polysilicon, single-crystal silicon, silicon germanium ($Si_xGe_y$), other materials not listed here, or combinations of materials. In one embodiment, the cantilever elements may be formed of polysilicon germanium (poly SiGe), as its processing temperature is compatible with CMOS wafer 102.

Each MEMS probe 110 includes a sharpened tip 116 at or near the free end of beam 114. Each sharpened tip 116 is formed of or coated with an electrically conductive material such that when the free end of beam 114 is deflected toward storage media 107 a current can be passed through sharpened tip 116 to either write data bits into the storage media or read data bits already written into the storage media. Each sharpened tip 116 is electrically coupled via beam 114 and pedestal 112, or via electrical traces in beam 114 and pedestal 112, to circuitry within CMOS wafer 102 that can read, write, amplify, decode, and perform other operations on data written to or read from storage media 107 by sharpened tip 116. In one embodiment each sharpened tip 116 is formed of amorphous silicon, although in other embodiments other types of materials can be used. Note that in some embodiments tip 116 may be coated with a conductive and wear-resistant material, such as platinum, although other materials may be used.

Figure 2A:
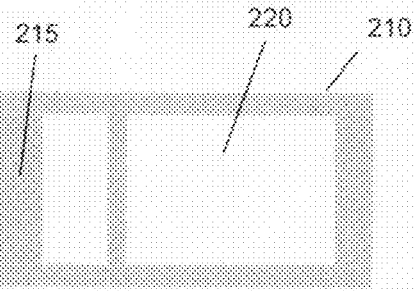
FIGS. 2A-2F are various steps of a process in accordance with one embodiment of the present invention.
Figure 2B:
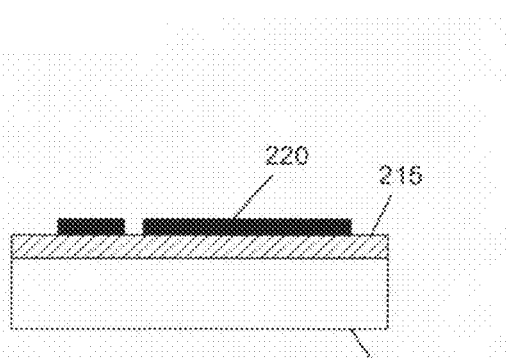

Referring now to FIGS. 2A-2F, shown are various steps of a process in accordance with one embodiment of the present invention. Shown in FIG. 2A is a top view of wafer undergoing process steps, while FIG. 2B shows a corresponding cross-section view. As shown in FIGS. 2A and 2B, a wafer 210, which may be a CMOS wafer including various circuitry has a protection layer 215 such as a polysilicon or oxide layer formed thereon. Note that the thickness of protection layer 215 may be based on a desired vertical actuation gap, in some embodiments. In turn, a bottom layer 220, which may act as an anchor layer for a cantilever structure, may be formed and patterned. In one embodiment, bottom layer 220 may be silicon germanium ($Si_xGe_y$) such as a poly SiGe although in other embodiments, bottom layer 220 may include polysilicon, single-crystal silicon, amorphous silicon, sputtered or electroplated metals, combinations thereof, or other materials.

Figure 2C:
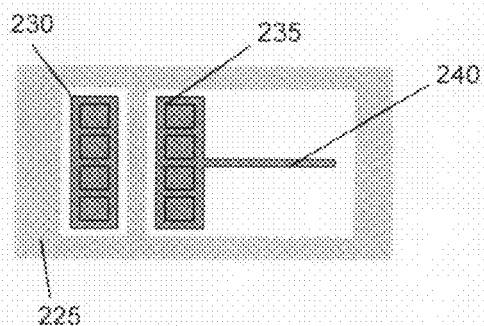
Figure 2D:
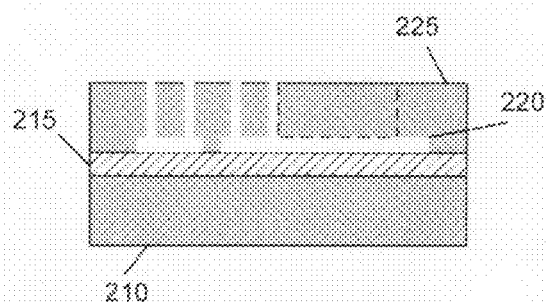

Next referring to FIGS. 2C and 2D which are top and cross-sectional views of next process steps, an oxide layer is formed and patterned. As shown in FIGS. 2C and 2D, oxide layer 225 may be a relatively thick layer, and in some embodiments may be between approximately 2-6 microns thick. As shown, oxide layer 225 may be patterned with high aspect ratio trenches to act as a mold for subsequent deposition processes. While the scope of the present invention is not limited in this regard, in some embodiments the aspect ratios may be between approximately 2:1 and approximately 8:1, and in particular embodiments the aspect ratio may be approximately 4:1. Thus in various implementations, such features may be less than twice the thickness of a subsequently deposited layer. As shown in FIG. 2C, in one embodiment, oxide layer 225 may be patterned with a substantially rectangular honeycomb-type pattern including a first portion 230 and a second portion 235 having a lateral extension 240 extending therefrom. First portion 230 may be used to build a lateral actuation portion while second portion 235 and extension 240 may be used to build a vertical actuation portion.

Figure 2E:
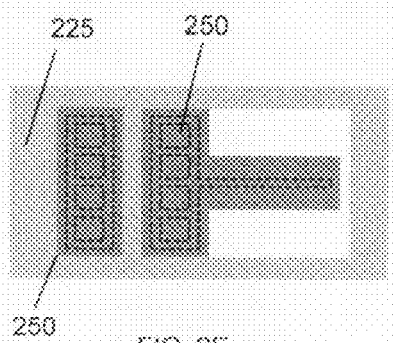
Figure 2F:
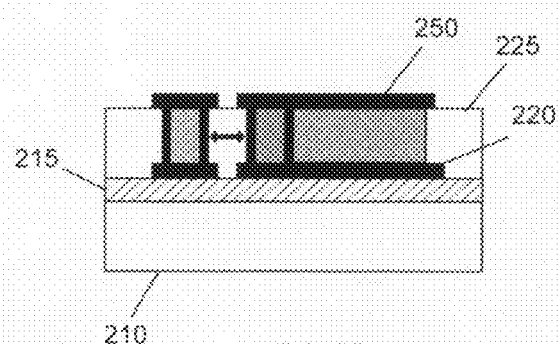

Referring now to FIGS. 2E and 2F, shown are top and cross-sectional views of next process steps in accordance with one embodiment of the present invention. As shown in FIGS. 2E and 2F, a layer 250, which may also be formed of poly-SiGe or another conductive layer, may be conformally deposited, filling the oxide trenches and forming layer 250 above oxide layer 225. In this way, a substantially honeycomb structure may be realized as shown in FIG. 2E. However, while shown with this particular shape in the FIG. 2 embodiment, understand that the scope of the present invention is not limited in this regard, and many different structures may be formed to provide support for a cantilever assembly capable of both vertical and lateral movement. Thus while shown with this particular structure and the processes set forth in FIGS. 2A-2F, the scope of the present invention is not limited in this regard, and various different process steps may be performed to realize a cantilever structure in accordance with different embodiments. Furthermore, understand that various other processing may be performed to realize a completed cantilever assembly capable of use in an SSP memory device.

Figure 3:
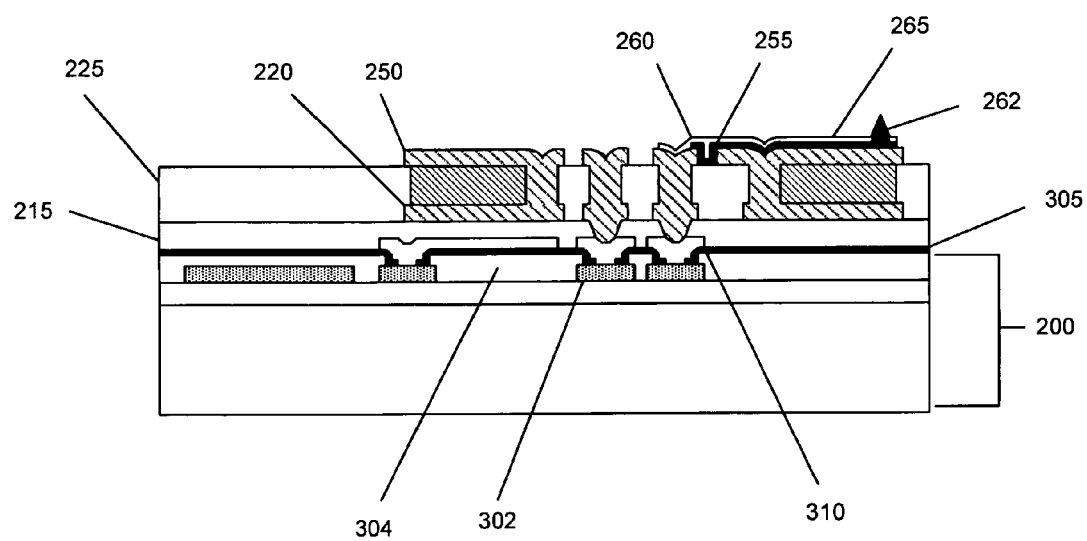
FIG. 3 is a cross-sectional view of a cantilever assembly in accordance with an embodiment of the present invention.

Referring now to FIG. 3, shown is a cross-sectional view of a more fully integrated cantilever assembly in accordance with an embodiment of the present invention. The use of like reference numerals as used in FIGS. 2A-2F are intended to denote common layers and features. FIG. 3 further shows additional elements and structures present in accordance with one embodiment. Specifically, as shown in FIG. 3, structure 300 may include a CMOS wafer 200 including multiple layers of CMOS circuitry formed on a substrate such as a silicon wafer. Shown specifically in the embodiment of FIG. 3 is a top metal layer 302 which may include, for example, connections to provide interconnection between a cantilever structure formed thereon and underlying circuitry such as amplifier circuitry, processing circuitry, logic circuitry and so forth. Over this top metal layer 302 a protection layer 304, which may be an oxide layer, is formed and patterned to expose the desired contacts in top layer 302.

Then as shown in FIG. 3, a ground plane layer 305, which may be formed of a relatively thin layer of poly-SiGe may be deposited and patterned. Over ground plane layer 305, oxide layer 215, which may be a sacrificial oxide layer is deposited and patterned to provide contact to the underlying structures. As shown in FIG. 3, bottom layer 220 may be deposited and patterned to form a vertical actuation electrode along with electrical contacts to various signal traces of top metal layer 302. Note that the remaining layers shown in FIG. 3 may be formed in accordance with the discussion above in FIGS. 2A-2F.

Thus oxide trenches within oxide layer 225 may be refilled with the poly-SiGe material of layer 250 to form high aspect ratio features, above which an insulation layer 255 may be formed and patterned. In various embodiments, different materials may be used for insulation layer 255. For example, in some implementations a silicon nitride (SiN) or a silicon carbon (SiC) may be deposited. After patterning of insulation layer 255, an amorphous silicon layer 260 may be deposited and patterned to form a probe tip 262, as well as to provide conductive material for a trace such as an input/output (I/O) trace. In various embodiments, layer 260 may be formed of amorphous silicon (a-Si) although the scope of the present invention is not limited in this regard. To enable a sharpened probe tip, a silicide-forming material 265 may be deposited to enable the sharpened tip. In various embodiments, silicide-forming material 265 may be a titanium, cobalt or nickel material, a combination thereof or another such material. The resulting wafer may then be annealed to enable formation of the silicide on tip probe 262 to enable a sharpened tip. Various etching steps such as a wet etch may be performed to remove the undesired portions of this silicide layer, then insulation layer 255 may be patterned and etched. Finally, in some embodiments a metal and/or tribological layer may be deposited and patterned (not shown in the embodiment of FIG. 3). Thus using the process steps set forth above regarding FIGS. 2A-2F as well as additional integration steps discussed above regarding FIG. 3, embodiments may form high-aspect ratio cantilever structures to enable both vertical and horizontal or lateral movement.

While set forth in this particular implementation as a trench refill process, in other embodiments a cantilever assembly capable of lateral and vertical movement may be formed using a deposition process in which a relatively thick layer of poly-SiGe or another such material may be deposited and patterned to form the cantilever assembly. Then by patterning, various trenches may be formed to define the structures of the cantilever. Referring now to FIGS. 4A-4J, shown is a process flow for formation of a cantilever in accordance with another embodiment of the present invention.

Figure 4A:
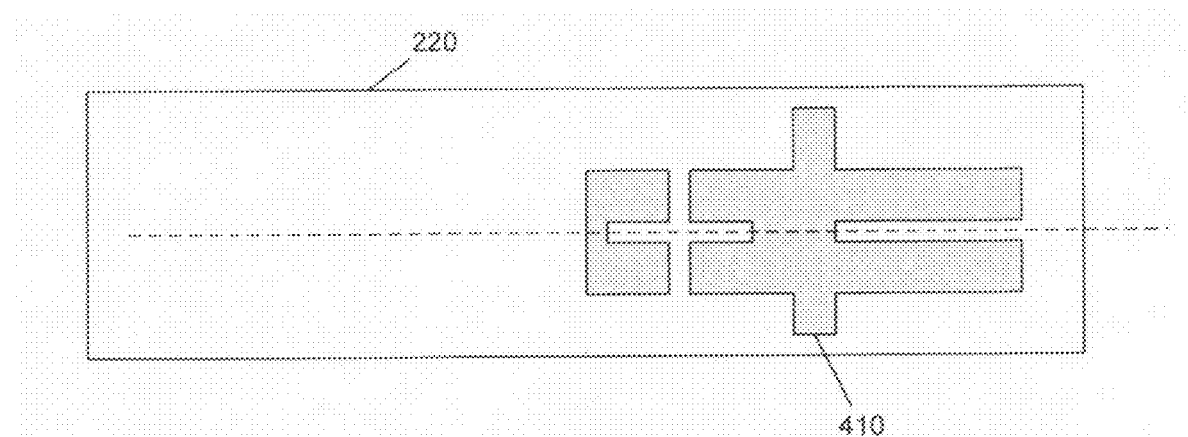
FIGS. 4A-4J are various steps of a process flow for formation of a cantilever in accordance with another embodiment of the present invention.
Figure 4B:
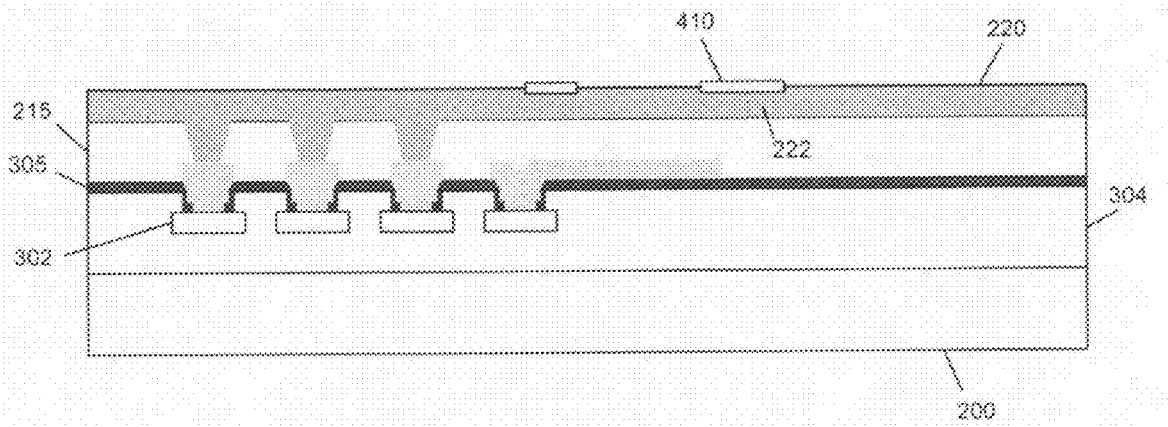

In this embodiment, rather than forming a thick sacrificial oxide layer through which a trench refill process is performed as described above in FIGS. 2A-2F, in the embodiment of FIGS. 4A-4J, a thick layer deposition of a cantilever material such as poly-SiGe may instead be deposited. FIGS. 4A and 4B show top and cross-sectional views of such a process. Note that the cross-section of FIG. 4B may correspond to that of FIG. 2B, with the addition of a dielectric hard mask layer 410 on poly-SiGe layer 220 (i.e., corresponding to layer 220 of FIG. 2B, for example). Note these drawings include additional details such as those shown in FIG. 3. More specifically, note that top metal layer 302 may include buried signal traces that provide a direct connection to CMOS circuitry in wafer 200 or routing traces to an edge of a device die. The openings may be etched into protection layer 304 to enable I/O access to such varied signal traces. In some embodiments, a protection dielectric layer may be deposited to protect an interlayer dielectric (ILD) 304 and a via etch may again be performed to allow access to varied signal traces of top metal layer 302. In some implementations such a protection dielectric layer may be an etch stop layer on the ILD which will not be etched in a final device release step such as a vapor hydrofluoric acid (HF) process. In some implementations a single protection dielectric layer may be formed, which is then patterned to provide via openings to the signal traces.

Dielectric layer 410 may be patterned as shown in FIG. 4A, for example, to form a hard mask stop for a later etch process. The dielectric hard mask may ford the cantilever and its suspension beam (i.e., a seesaw torsional beam) after such an etch process. Specifically, as shown in FIG. 4B, SiGe layer 220 may include a portion 222 which corresponds to a seesaw torsional beam for the cantilever assembly.

Figure 4C:
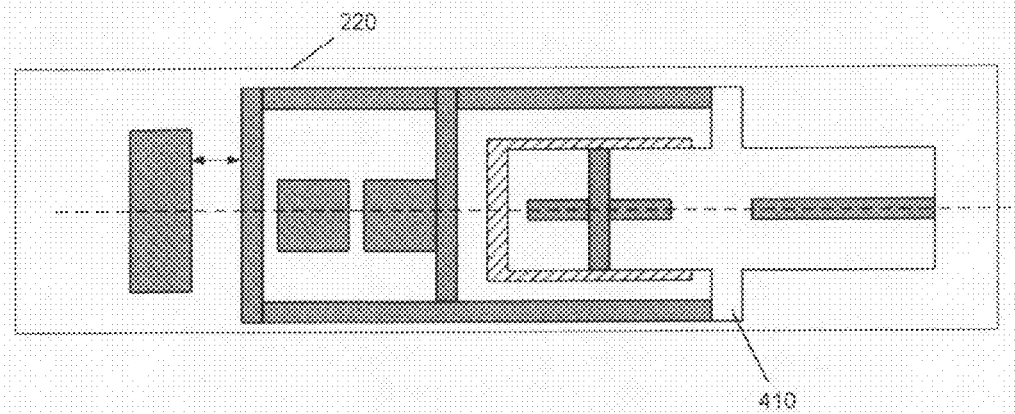
Figure 4D:
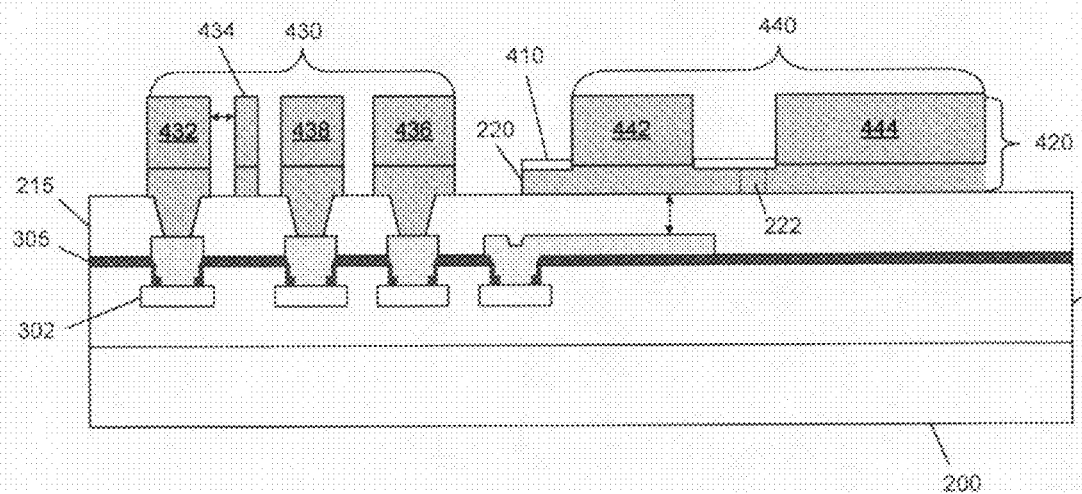

Referring now to FIGS. 4C and 4D, shown are top view and cross-sectional views of further processes. As shown in FIGS. 4C and 4D, a relatively thick layer 420 may be formed over dielectric hard mask layer 410 and lower SiGe layer 220 to thus provide a full stack for a lateral actuation structure. In various embodiments, this layer may be approximately 3 microns thick, although the scope of the present invention is not limited in this regard. This layer may be patterned to form a lateral actuation structure which may include an actuation electrode and a suspension beam. Thus as shown in FIGS. 4C and 4D, a lateral actuation structure 430 may be formed which includes a lateral actuation electrode 432 and a suspension beam 434. In addition, the patterning may provide contacts to enable a cantilever/lateral structure ground electrode 436 and a data and control electrode 438 to enable read, write and erase operations. Also shown is a vertical actuation structure 440, which may include a first fin stiffener 442 and a second fin stiffener 444, which are formed on opposing sides over dielectric hard mask layer 410, which in turn is formed over seesaw torsional beam 222. Accordingly, because the cantilever region is protected by the dielectric hard mask, a thick cantilever structure (e.g., between 0.5 and 1 micron in one embodiment) may be formed from a resistive ion etch (RIE). Fin stiffeners 442 and 444 may provide cantilever support to enable cantilever bimorph bending reduction. The RIE may be used to achieve a narrow actuation gap of approximately 0.5 microns between lateral actuation electrode 432 and lateral suspension beam 434. Furthermore, this etch may thus form suspension beam 434 with a relatively narrow width, e.g., between approximately 1.0 and 2.0 microns in one embodiment.

Then dielectric hard mask layer 410 may be removed using a hard mask dielectric strip to remove the hard mask material from the portions of vertical actuation structure 440. Next, a sacrificial planarization deposition may be performed to form a thick sacrificial oxide layer above the structure of FIGS. 4C and 4D (after the hard mask dielectric strip, not shown in FIGS. 4C and 4D). Such a thick sacrificial oxide deposition may be performed to fill the high topography variation of the cantilever assembly. Then a planarization such as a chemical mechanical polishing (CMP) operation may be performed to planarize the wafer and expose the top surface of the cantilever structure.

Figure 4E:
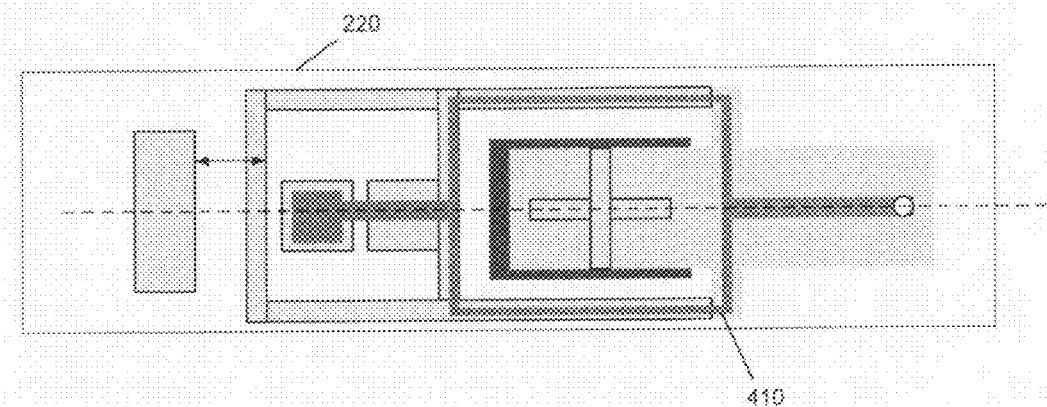
Figure 4F:
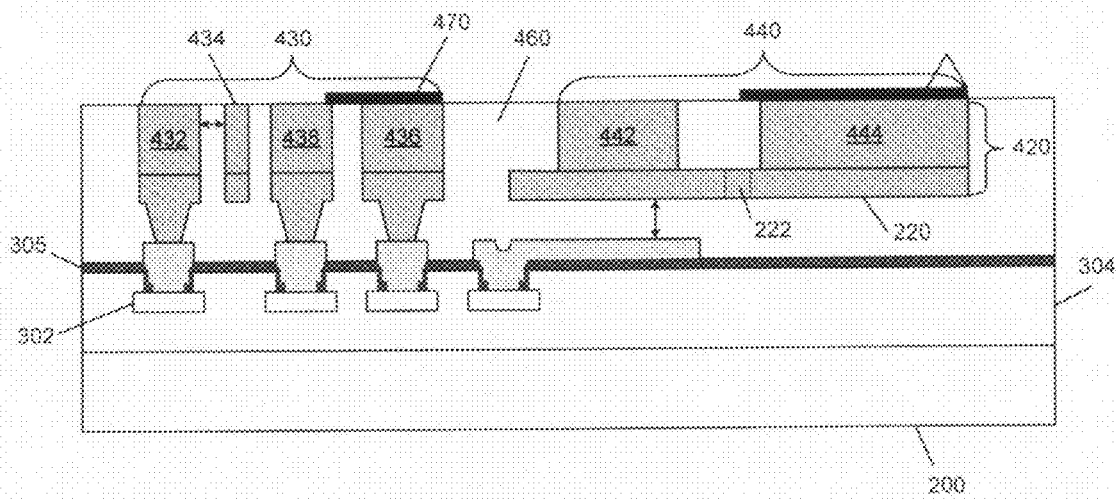
Figure 4G:
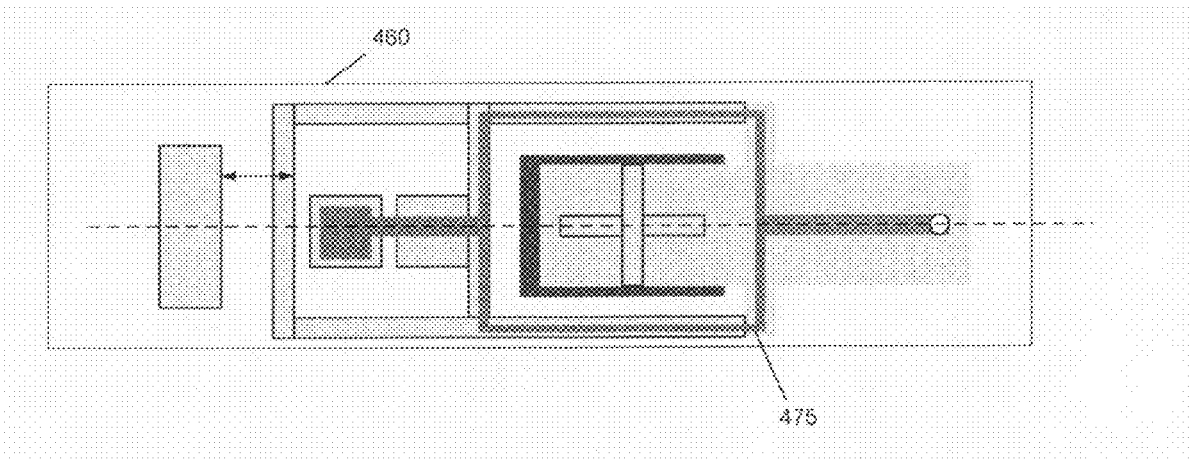
Figure 4H:
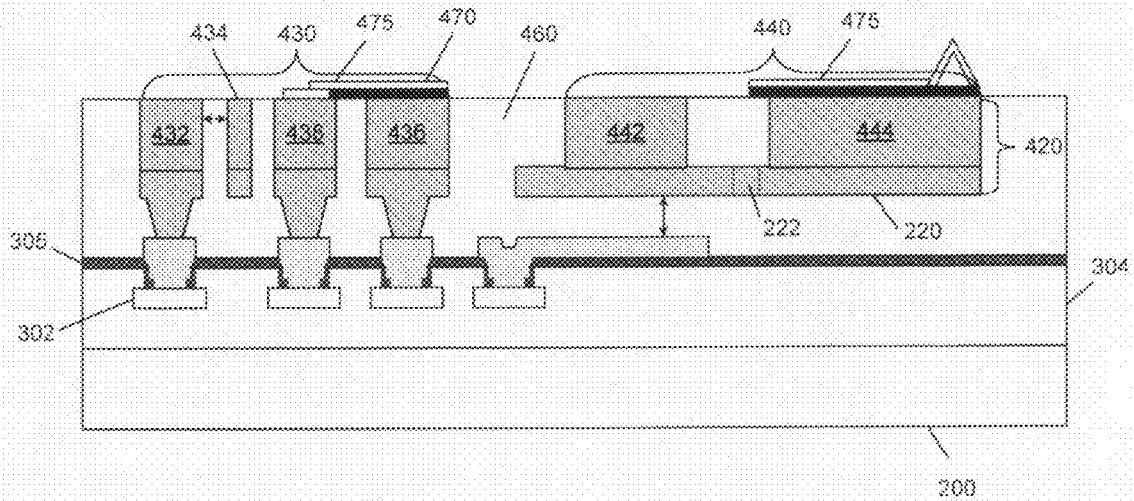

Above this planarized structure which includes a sacrificial oxide layer 460 as shown in FIGS. 4E and 4F, a trace isolation dielectric and a tip layer may be deposited. The tip layer may then be patterned, e.g., using a tip undercut etch to obtain a probe tip, which may then be sharpened using an annealing process such as described above. Such trace dielectric layer may also serve as a tip etch stop and protection layer during the tip sharpening process. After tip formation, the trace dielectric layer may be patterned as shown in FIGS. 4E and 4F. Specifically, trace dielectric layer 470 may be patterned as shown in FIGS. 4E and 4F to provide a trace isolation dielectric and a base for a suspended data trace layer. Next, a data trace layer 475 may be deposited and patterned as shown in FIGS. 4G and 4H. Furthermore, a tip tribological coating may also be deposited and patterned.

Figure 4I:
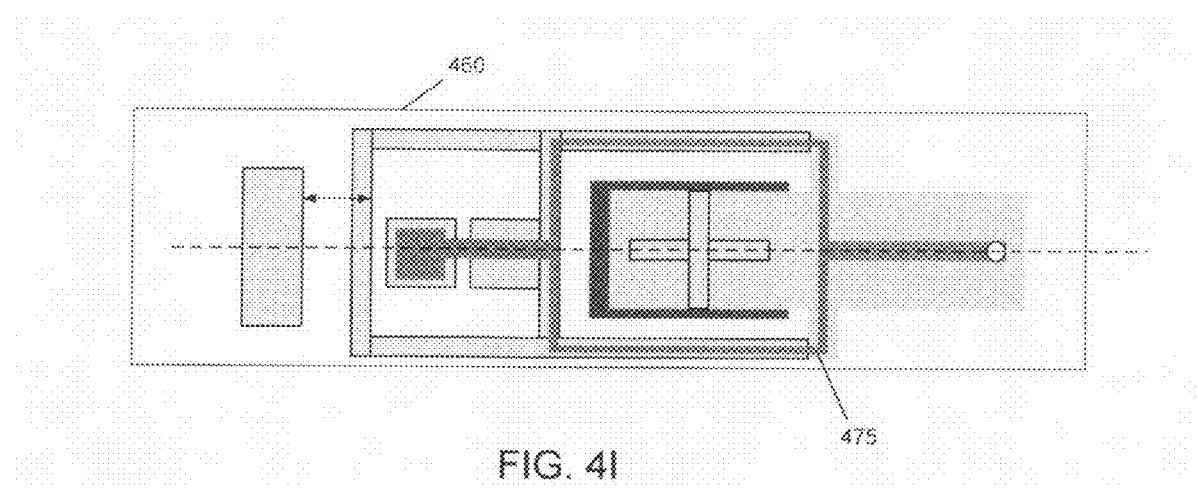
Figure 4J:
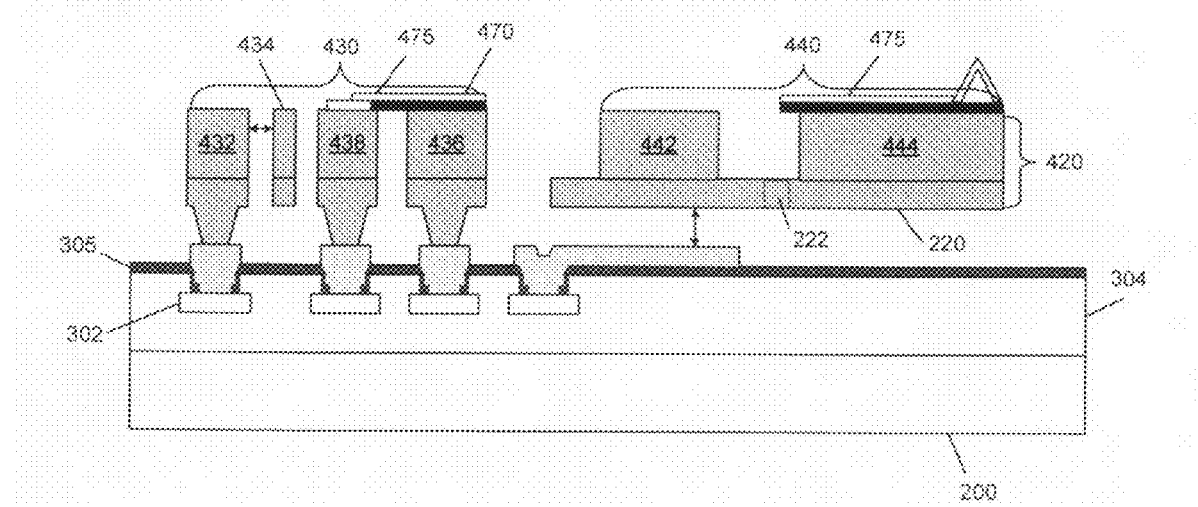

As shown in FIGS. 4G and 4H trace layer 475 is laying upon top of thick actuation layer 420 except for the region above cantilever region 222 and the region between data I/O electrode 434 and cantilever ground anchor 438. The trace on sacrificial oxide layer 460 will be suspended when the oxide layer is removed. The suspended trace above cantilever portion 222 may reduce its stress effect on cantilever actuation. Note that the I/O trace may be isolated from the cantilever assembly by sacrificial oxide layer 460 until the data contact is formed. The final cantilever assembly may be realized by performing a sacrificial oxide removal process, which may be performed via a vapor release in one embodiment. Thus a resulting structure is shown in FIGS. 4I and 4J. Note that in FIGS. 4I an 4J, the resulting structure thus provides a suspended data trace to reduce the trace stress effect on the torsional beam's spring constant. While shown with this particular implementation in the embodiment of FIGS. 4A-4J, understand the scope of the present invention is not limited in this regard, and other manners and structures to enable lateral and vertical movement of a probe tip cantilever accordingly may be realized.

Figure 5:
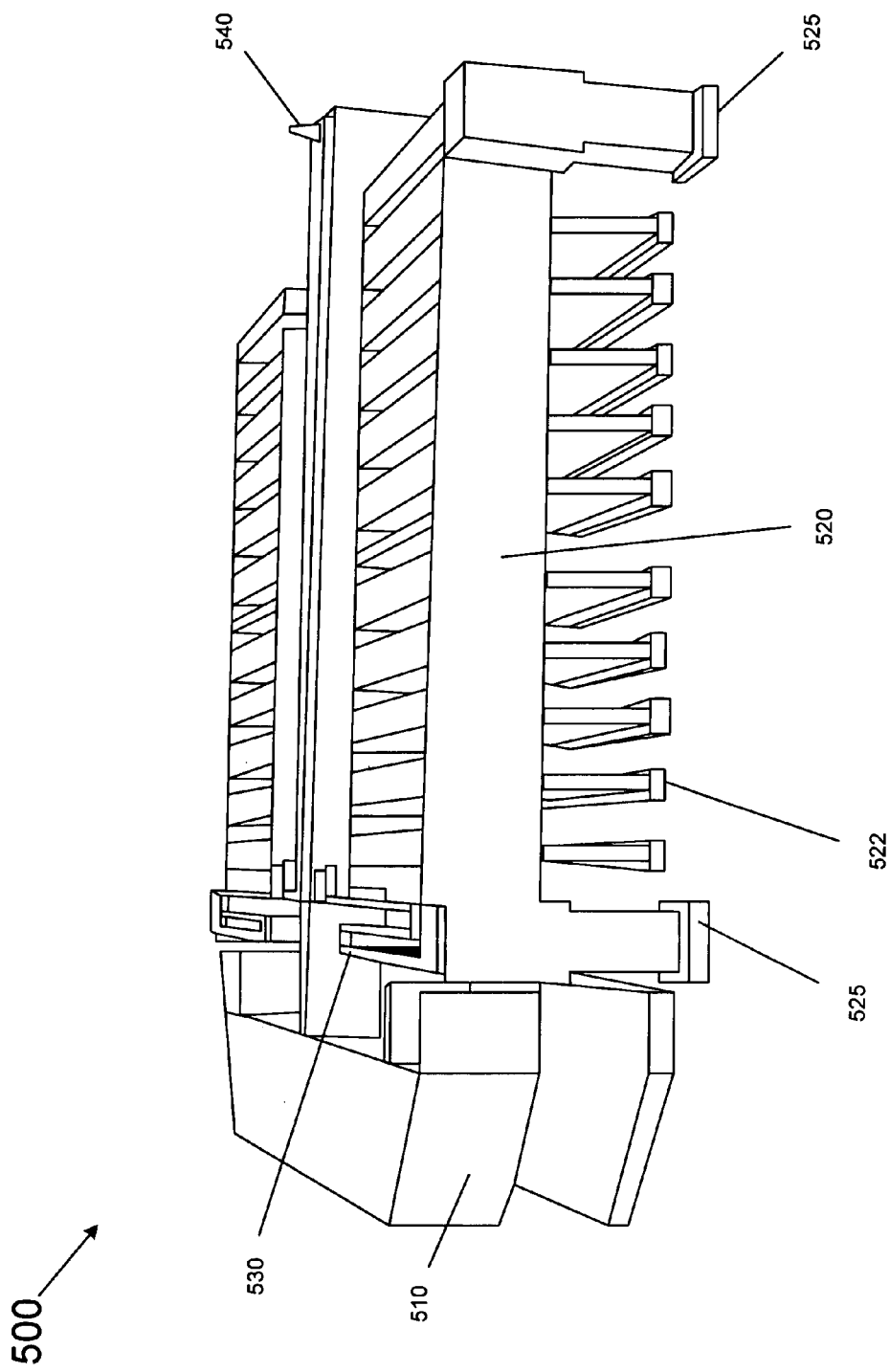
FIG. 5 is a plan view of a probe in accordance with an embodiment of the present invention.

Referring now to FIG. 5, shown is a plan view of a MEMS probe 500 in accordance with an embodiment of the present invention. As shown in FIG. 5, MEMS probe 500 includes a lateral actuation portion 510 and a vertical actuation portion 520. Note that vertical actuation portion 520 includes a plurality of anchors 525 and a plurality of fins 522. Above this structure, a data trace 530 may be formed which, in some implementations may be suspended over at least parts of the structure to reduce trace stress effects on the torsional beam's spring constant. As further shown in FIG. 5, a probe tip 540 may be located at a distal end of data trace 530. MEMS probe 500 may be formed using, for example, the processes described above with regard to FIGS. 2A-2F and FIGS. 4A-4J. Note that FIG. 5 does not show lower layers, such as a metal trace anchor, CMOS layers, among other such structures. While shown with this particular implementation in the embodiment of FIG. 5, the scope of the present invention is not limited in this regard and MEMS probes may take other configurations in different embodiments.

Figure 6:
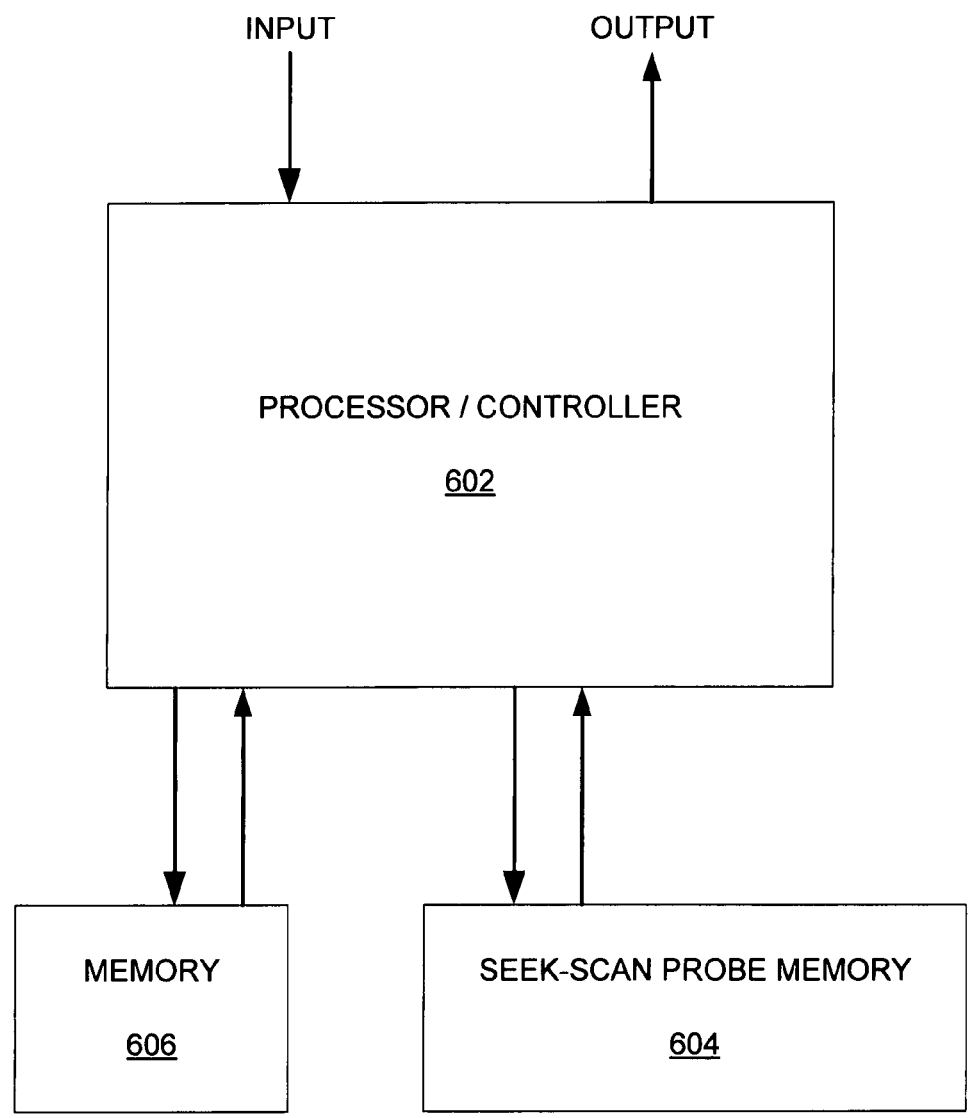
FIG. 6 is a block diagram of a system in accordance with one embodiment of the present invention.

FIG. 6 illustrates an embodiment of a system 600 that includes a seek-scan probe (SSP) memory using one or more MEMS probes. System 600 includes a processor 602 to which is coupled a memory 606 and an SSP memory 604. Processor 602, in addition to being coupled to memories 604 and 604, has an input and an output through which it can receive and send data, respectively. In one embodiment processor 602 can be a general-purpose microprocessor, although in other embodiments processor 602 can be another type of processor, such as a programmable controller or an application-specific integrated circuit (ASIC).

Memory 606 can be any type of volatile or non-volatile memory or storage. Volatile memories that can be used in different embodiments of memory 606 include random access memory (RAM), dynamic random access memory (DRAM), synchronous random access memory (SRAM) and synchronous dynamic random access memory (SDRAM), erasable programmable read only memory (EPROM), electrically erasable programmable read only memory (EEPROM), and the like. SSP memory 604 can, in different embodiments, be a memory that includes one or more MEMS probes formed in accordance with an embodiment of the present invention.

In operation of system 600, processor 602 can receive and send data through its input and output, and can both read and write data to both the memory 606 and the SSP memory 604. Through appropriate software, processor 602 can control the reading, writing and erasure of data in SSP memory 604 by selectively changing the relevant media property (phase change, electric dipole formation, etc) of the storage media used in the SSP memory.

Thus using embodiments of the present invention, a cantilever assembly may be realized that includes a thin cantilever layer with a torsional beam and a bottom electrode for vertical actuation, along with a thick actuatable micro-platform with a lateral actuation electrode. Still further, a sharp probe tip may be realized to enable nanometer data read, write, and erase, along with a low-resistance conduction trace for data storage transmission. Furthermore, because the cantilever assembly may be performed using low-temperature processes, the cantilever structure may be directly fabricated on a CMOS wafer.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a sacrificial oxide layer on a base layer of a microelectromechanical systems (MEMS) probe, the MEMS probe formed on a wafer including complementary metal oxide semiconductor (CMOS) circuitry;
   patterning the sacrificial oxide layer to provide a first trench pattern having a substantially rectangular form and a second trench pattern having a substantially rectangular portion and a lateral portion extending from the substantially rectangular portion; and
   depositing a conductive layer on the patterned sacrificial oxide layer to fill the first and second trench patterns to form a support structure for the MEMS probe and a cantilever portion of the MEMS probe, the MEMS probe to move laterally and vertically.

2. The method of claim 1, further comprising forming the sacrificial oxide layer over the base layer, wherein the base layer further includes a first electrode to enable the lateral movement and a second electrode to enable the vertical movement.

3. The method of claim 2, further comprising forming a data electrode between the first electrode and the second electrode, wherein the data electrode is to communicate data to and from a probe tip formed on the cantilever portion.

4. The method of claim 1, wherein the support structure and the cantilever portion have an aspect ratio greater than approximately 2:1.

5. The method of claim 1, wherein the cantilever portion includes a honeycomb structure having the sacrificial oxide layer disposed between the base layer and the conductive layer.

6. A method comprising:
   forming a first cantilever layer over an oxide layer, the oxide layer having a plurality of openings such that the first cantilever layer contacts a plurality of contacts of a top metal layer of a complementary metal oxide semiconductor (CMOS) circuit formed above a substrate, the first cantilever layer including a torsional beam portion;
   forming a dielectric layer above the first cantilever layer and patterning the dielectric layer to form a mask to ford the torsional beam portion;
   forming a lateral actuation layer over the first cantilever layer and the patterned dielectric layer and patterning the lateral actuation layer to form a lateral actuation structure including a lateral actuation electrode, a data electrode separated from the lateral actuation electrode by a suspension beam, and a ground electrode adjacent to the data electrode, and a vertical actuation structure including a pair of fin stiffeners adapted on either side of the torsional beam portion; and
   forming a trace stack including a probe tip, the trace stack including a dielectric layer and a conductive layer, wherein the trace stack is suspended above the torsional beam portion.

7. The method of claim 6, wherein the lateral actuation layer is to enable movement of the probe tip in a lateral direction.

8. The method of claim 7, further comprising forming a conductive layer below the oxide layer, the conductive layer to provide a vertical electrode portion to enable movement of the probe tip in a vertical direction.

9. The method of claim 6, wherein the trace stack is suspended above a region between the data electrode and the ground electrode.

10. The method of claim 9, further comprising forming a sacrificial oxide layer above the patterned lateral actuation layer and planarizing the sacrificial oxide layer to expose a top portion of the lateral actuation structure.

11. The method of claim 10, further comprising removing the sacrificial oxide layer by a vapor release operation to provide the suspended trace stack.

\* \* \* \* \*